United States Patent [19]

Chikasue

[11] Patent Number: 4,553,093
[45] Date of Patent: Nov. 12, 1985

[54] TACHOMETER

[75] Inventor: Hideo Chikasue, Shimada, Japan

[73] Assignee: Yazaki Sogyo Kabushiki Kaisha, Tokyo, Japan

[21] Appl. No.: 473,504

[22] Filed: Mar. 8, 1983

[51] Int. Cl.[4] ............................ G01P 3/48; G01P 3/54
[52] U.S. Cl. ................................ 324/169; 324/154 R; 324/166
[58] Field of Search ............... 324/173, 174, 166, 167, 324/169, 154 R, 151 R, 151 A

[56]         References Cited

U.S. PATENT DOCUMENTS 4,291,268  9/1981  Okuyama ..................... 324/154 R

FOREIGN PATENT DOCUMENTS 0616870  3/1961  Canada ................................. 324/173

OTHER PUBLICATIONS

Buckwalter, Knight-Kit Tachometer, Radio Electronics, Feb. 1962, pp. 42 and 43.

*Primary Examiner*—Stanley T. Krawczewicz
*Assistant Examiner*—Jack B. Harvey
*Attorney, Agent, or Firm*—Pollock, Vande Sande and Priddy

[57]         ABSTRACT

A detection signal of a frequency corresponding to a rotational frequency is applied to a frequency-voltage converter and its converted voltage signal is provided to a sine-cosine current generator, from which sine-wave and cosine-wave currents having sine and cosine values corresponding to the voltage value of the voltage signal are supplied to a cross-coil rotary magnet type indicator for providing an indication of the rotational frequency by a pointer. When the power source is cut off, interruption of the power source voltage supply to the frequency-voltage converter and the sine-cosine current generator is delayed by delay means and, in the delay time, the input to the sine-cosine current generator is reduced, returning the pointer to the zero point. The indicator further includes a zero-resetting magnet which interacts with the rotary magnet to force the pointer to move to said zero point.

7 Claims, 15 Drawing Figures

TACHOMETER

BACKGROUND OF THE INVENTION

The present invention relates to a tachometer for measuring the rotating speed of an engine or the speed of a vehicle which is detected in the form of a rotating speed and, more particularly, to a tachometer which employs a cross-coil type indicator in its indicating portion.

Tachometers heretofore employed for vehicles are the moving-coil type. The moving-coil type tachometer is what is called a precision instrument, which is complex in construction, easy to break and large in the number of parts used and calls for many troublesome steps for the assembling thereof, and hence is expensive.

In view of the above, the cross-coil type tachometer has recently come into use. The cross-coil type tachometer is disclosed, for example, in U.S. Pat. No. 3,327,208 issued June 20, 1967. The cross-coil type tachometer is simple in construction, small in the number of parts used, easy to assemble, inexpensive and, in addition, sturdy and highly reliable. With the cross-coil type indicator, when cutting off the supply of its power source voltage, the pointer usually remains at the position of indication immediately before the voltage supply is cut off. In the case where the cross-coil type indicator is used in a tachometer for detecting the engine speed of a vehicle, it is not preferable that even after an ignition switch is turned off to stop the rotation of the engine, the indicator still indicates the engine speed immediately before the ignition switch is turned off. To avoid this, the tachometer is equipped with zero resetting means for resetting the pointer to a reference position (a zero point) when the supply of the working voltage is cut off. The zero resetting means for use in the moving-coil type indicator employs a hair spring but this introduces complexity in the indicator structure, offsetting the advantages of the cross-coil type indicator.

There has been proposed zero resetting means of the type in which a small zero resetting permanent magnet is provided adjacent a pointer driving magnet. In this case, if the magnetic force of the zero resetting magnet is increased, no correct indications are provided under the influence of the increased magnetic force and, in addition, errors differ with the angular positions of the pointer. The torque for returning the pointer to the reference position by the zero resetting magnet differs with the angular positions of indications by the pointer, so that a decrease in the magnetic force of the zero resetting magnet introduces the possibility that the pointer cannot be returned to the reference position depending on the angular position of the pointer at the time of the power source being cut off. In order that the zero resetting magnet may have a sufficient torque for returning the pointer to the reference position, and that the influence of the zero resetting magnet on the indication may be made negligible, it is necessary that the intensity of the magnetic field of the zero resetting magnet be below 1% of the signal magnetic field by the cross coil for energizing the pointer driving magnet. To perform this, the cross coil must be supplied with a large drive current and given a large number of turns; therefore, an increase in the magnetic force of the zero resetting magnet is not preferable.

In a cross-coil type indicator adapted for providing graduations over a wide angular range of more than 180 degrees, it may happen that, depending on the angular position of the pointer at the time of turning off the power supply, the pointer, when returning to the reference position, is turned by the zero resetting magnet in the direction in which the meter indication increases. This causes such an impression as if the engine or the indicator is out of order. Furthermore, when a stopper is used for stopping the pointer at the reference position, the pointer cannot be correctly brought back to the reference position in the abovesaid case and, when driven next, the pointer does not turn in the direction in which the meter indication increases, but it turns in the opposite direction to indicate the rotating speed at that time; this also produces a strange feeling on the user.

SUMMARY OF THE INVENTION

It is therefore an object of the present invention to provide a tachometer in which when the power supply is turned off, the pointer turns in the direction in which the meter indication decreases, and returns correctly to the reference position and in which the zero resetting means therefor is simple-structured.

Another object of the present invention is to provide a tachometer which uses small torque for driving the pointer but is small in error and ensures to return the pointer to the reference position.

According to the present invention, when the operating power source for a frequency-voltage converter and a sine-cosine current generator is cut off, actual interruption of operating voltages to these circuits is delayed by delay means. In the case where the return to zero magnet is used, the interruption of the voltage supply is delayed until the input to the sine-cosine current generator becomes smaller than a predetermined value, that is, until the pointer turns back to an angular position where it is able to return to the reference position turning in the direction in which the meter indication decreases. In the case where the zero resetting magnet is not used, the interruption of the voltage supply is delayed until the input to the sine-cosine current generator becomes substantially its minimum value. As described above, when the power supply is cut off, the input to the sine-cosine current generator decreases and, for a certain period of time, the sine-cosine current generator keeps on operating, so that the pointer turns in the direction in which the meter indication decreases. The delay means can easily be achieved by precharging a capacitor with the power source voltage and gradually discharging the capacitor after cutting off the power supply. When the power source voltage has become lower than a predetermined value, a zero resetting circuit detects it and reduces the output of the frequency-voltage converter.

DESCRIPTION OF THE PREFERRED EMBODIMENTS

Figure 1:
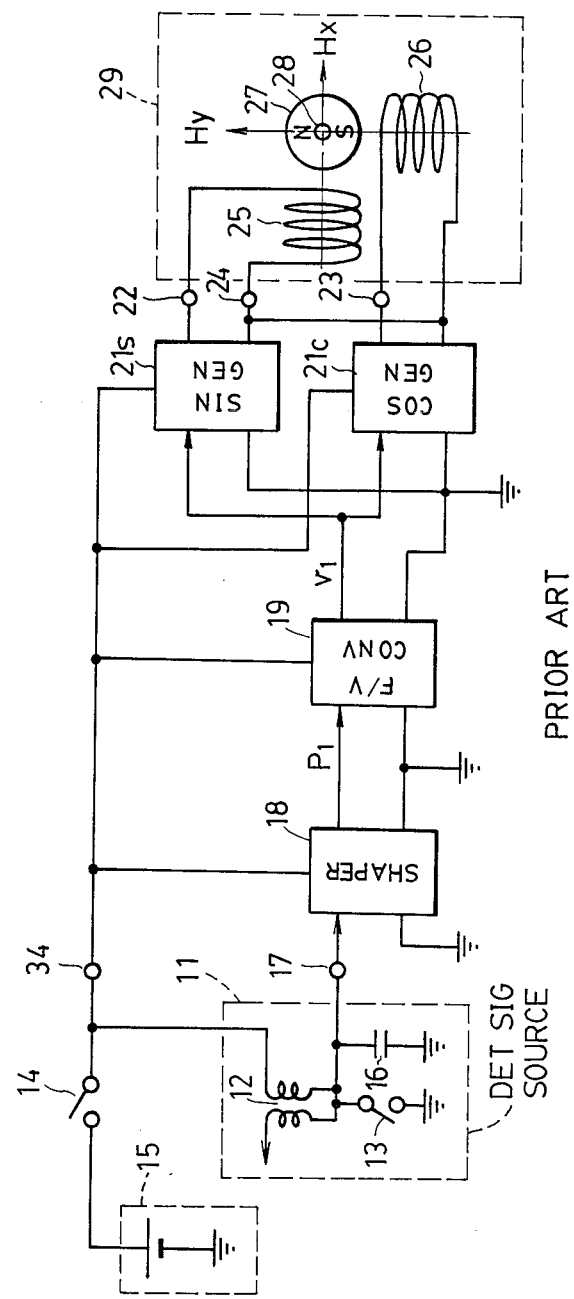
FIG. 1 is a block diagram showing a conventional tachometer.

For a better understanding of the present invention, a description will be given first, with reference to FIG. 1, of a conventional tachometer. A detection signal source 11 generates a detection signal of a frequency corresponding to the rotational frequency to be measured; for instance, in the case of a tachometer for a vehicle engine, the detection signal source 11 is an ignition system of the engine. An ignition coil 12 is grounded via a breaker point switch (a cam switch) 13 and connected to a power source 15 (a battery mounted in the vehicle) via a power source switch, in this example, an ignition switch (an engine key switch) 14. A capacitor 16 is connected in parallel to the breaker point switch 13. From the connection point of the ignition coil 12 and the breaker point switch 13 is derived by the on-off operation of the switch 13 at a terminal 17 such pulses as shown in FIG. 2A which have a frequency corresponding, for example, to the engine speed. The frequency of the pulse corresponds to the engine speed, that is, the number of revolutions per unit time.

Figure 2A:
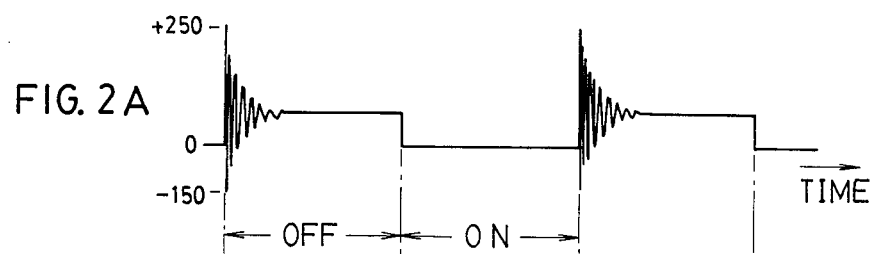
FIG. 2A shows an example of the waveform of an input detection signal.
Figure 2B:
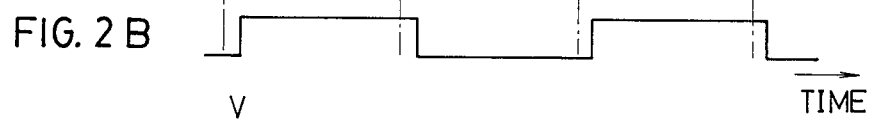
FIG. 2B shows the output waveform obtained by waveform-shaping the input detection signal.
Figure 3A:
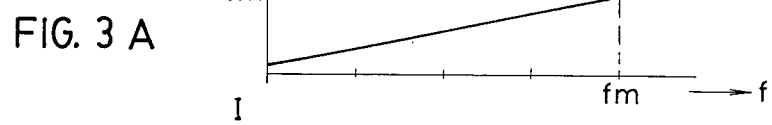
FIGS. 3A to 3D are graphs explanatory of the operation of the conventional tachometer shown in FIG. 1.

The detection signal from the detection signal source 11 is shaped, as required, by a waveform shaping circuit 18 into a square wave signal shown in FIG. 2B, which is applied as an input signal $P_1$ to a frequency-voltage converter 19. The frequency-voltage converter 19 yields such a voltage signal $v_1$ as shown in FIG. 3A which has a voltage value V corresponding to the frequency f of the input signal $P_1$. For this frequency-voltage conversion, measurement conditions are preset to determine a maximum measurable frequency $f_m$ and a maximum convertible voltage value $V_m$ is given correspondingly thereto and the frequency-voltage conversion is performed within this range. The voltage signal $v_1$ available from the frequency-voltage converter 19 is applied as an input signal to each of sine-wave and cosine wave current generators 21s and 21c.

Figure 3B:
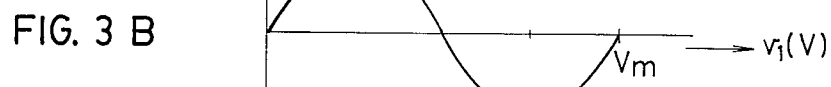
Figure 3C:
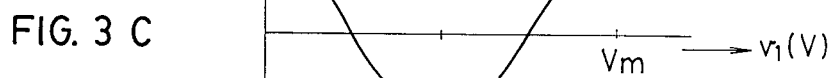

The sine current generator 21s yields at its output terminal 22 such a one cycle of sine-wave current signal $i_s$ with respect to the input $v_1$ as shown in FIG. 3B. The one cycle of sine-wave corresponds to the voltage range from a voltage value corresponding to the zero frequency of the voltage signal $v_1$ to the maximum convertible voltage value $V_m$ and the current value I of which varies substantially in a sinusoidal manner with respect to the voltage value V of the voltage signal $v_1$. Similarly, the cosine-wave current generator 21c yields at its output terminal 23 such a one cycle of cosine-wave current signal $i_c$ as shown in FIG. 3C. The one cycle corresponds to the voltage range from a voltage value corresponding to the zero frequency of the voltage signal $v_1$ to the maximum convertible voltage $V_m$. The current value I varies substantially in a cosine-wave manner with respect to the voltage value V of the voltage signal $v_1$. Such sine-wave and cosine-wave current generators 21s and 21c are fabricated as a semiconductor integrated circuit together with the frequency-voltage converter 19 and now commercially available, for example, under the name of "Tachometer Drive I.C." by Cherry Semiconductor Inc. of the United States.

Between the output terminal 22 of the sine current generator 21s and a common terminal 24 is connected a first coil 25 and a second coil 26 is similarly connected between the output terminal 23 of the cosine current generator 21c and the common terminal 24. The first and second coils 25 and 26 are disposed with their axes perpendicularly intersecting each other. Substantially at the position of intersection of the axes of the first and second coils 25 and 26 a rotary magnet 27, which is rotatable about an axis perpendicularly intersecting both the axes of the first and second coils, is disposed substantially entirely surrounded by the first and second coils 25 and 26. The rotary magnet 27 is magnetized with north and south magnetic poles in a direction perpendicular to its axis of rotation. Though not shown, a pointer is mounted on a rotary shaft 28 of the rotary magnet 27. The pointer, the dial and the rotary magnet 27 constitute a cross-coil type indicator 29.

The sine current signal $i_s$ derived at the output terminal 22 of the sine current generator 21s flows through the first coil 25 to produce a first magnetic field Hx in the x-axis direction, and the cosine current signal $i_c$ obtained at the output terminal 23 of the cosine current generator 21c flows through the second coil 26 to form a second magnetic field Hy in the y-axis direction. Accordingly, the rotary magnet 27 assumes a rotational angular position corresponding to the composite magnetic field H given by the vector sum of the first and second magnetic fields Hx and Hy.

Figure 3D:
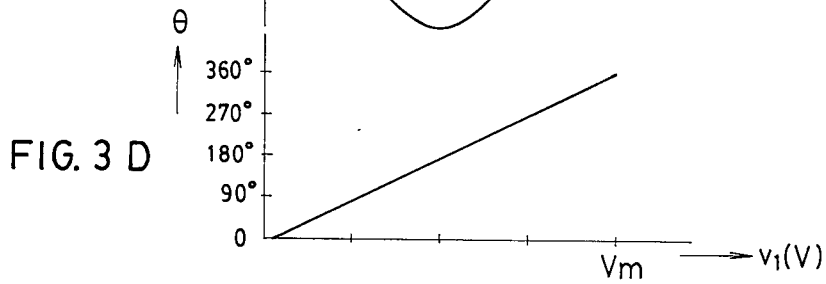
Figure 4:
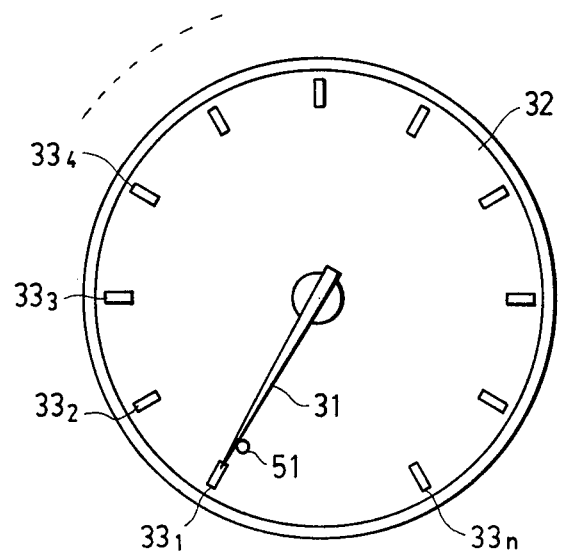
FIG. 4 is a schematic diagram showing an example of a dial of the tachometer.

The first and second magnetic fields Hx and Hy are proportional to the current values I of the current signals $i_s$ and $i_c$, respectively, and the direction of the composite magnetic field H of the first and second magnetic fields Hx and Hy corresponds to phase angles in the sine-wave and cosine-wave current values in FIGS. 3B and 3C; therefore, the direction $\theta$ of the composite magnetic field H and the voltage signal $v_1$ correspond to each other as shown in FIG. 3D. Consequently, the rotary magnet 27 disposed in the composite magnetic field H rotates about the shaft 28 by an angle corresponding to the voltage signal $v_1$. Thus, the frequency of the detection signal from the detection signal source 11 is displayed as the rotational angle of the rotary magnet 27. As shown in FIG. 4 a pointer 31 is mounted on the shaft 28 of the rotary magnet 27 and it turns on an array of meter graduations $33_1$ to $33_n$ provided on a dial 32.

The waveform shaping circuit 18, the frequency-voltage converter 19, the sine current generator 21s and the cosine current generator 21c are each supplied with an operating voltage via a common power source terminal 34 as shown in FIG. 1. In this example, the voltage is applied from the power source 15 to the common power source terminal 34 via the ignition switch 14. Accordingly, upon cutting off the voltage supply to the common power source terminal 34 by turning off the ignition switch 14, the waveform shaping circuit 18, frequency-voltage converter 19, the sine current generator 21s and the cosine current generator 21c are immediately stopped from operation and the pointer 31 on the dial 32 stays at the position of indication just before the cutting off of the power source voltage. The pointer 31 thus stopped at an intermediate position between the graduations $33_1$ and $33_n$ must be returned to a reference position, for instance, the zero point $33_1$. To perform this, it is general practice in the prior art to dispose a small zero resetting magnet in close proximity to the rotary magnet 27, though not shown, by which one of the magnetic poles of the rotary magnet 27 stopped halfway is magnetically attracted to turn, returning the pointer 31 to the zero point $33_1$.

If the magnetic field intensity of the zero resetting magnet is increased so as to ensure the zero resetting operation, the rotational movement of the rotary magnet 27 during indication is affected by the magnetic field of the zero resetting magnet to introduce a large error in the indication by the pointer 31, and the error changes depending on the rotational position of the pointer 31 and, further, conditions for smooth rotational movement of the pointer 31 are not satisfied. Moreover, according to the position of the pointer 31 immediately before cutting off the power source voltage, the pointer 31 may return to the zero point, turning on the dial 32 in the opposite direction, that is, in the direction in which the meter indication increases. This is not preferable because the zero resetting operation causes the pointer 31 to indicate an increase in the engine speed although the rotation of the engine is stopped by turning off the ignition switch 14. On the other hand, when the magnetic field intensity of the zero resetting magnet is made too low, it may happen sometimes that the pointer 31 within some rotational angular region may not be returned to the zero point since the pointer returning torque by the zero resetting magnet differs according to the rotational position of the pointer 31.

Figure 5:
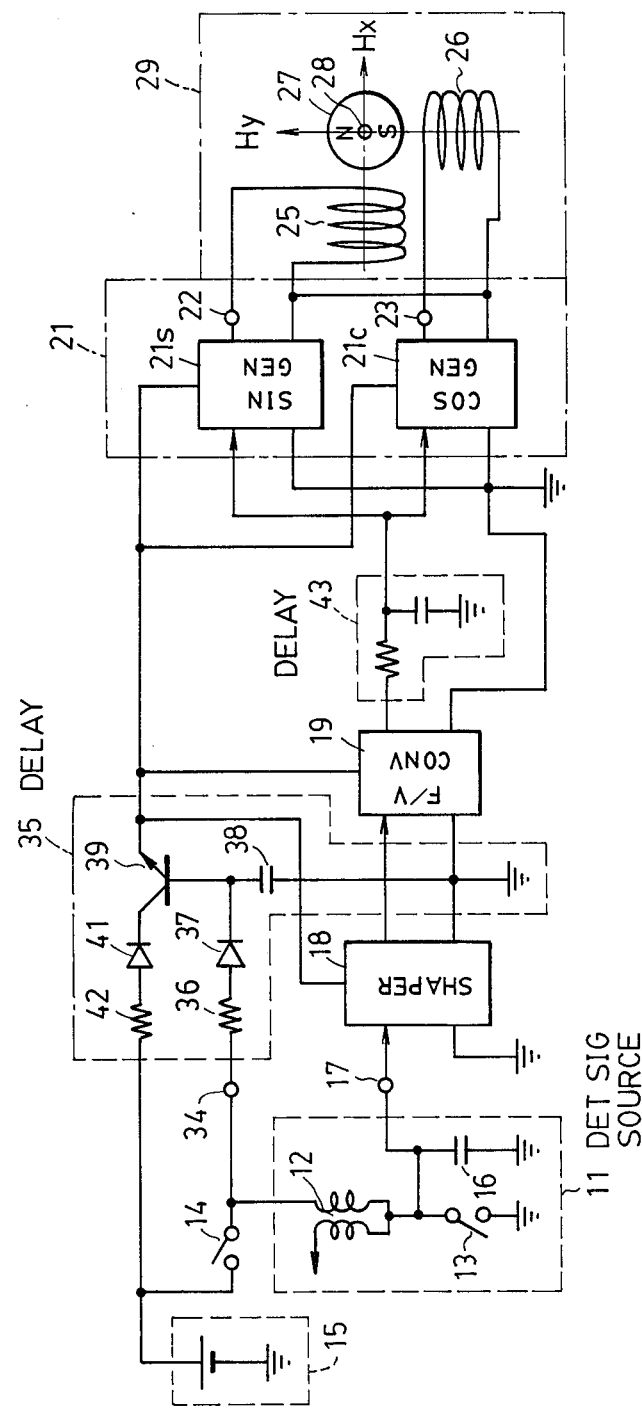
FIG. 5 is a block diagram illustrating an embodiment of the tachometer of the present invention.

FIG. 5 illustrates an embodiment of the tachometer of the present invention, in which the parts corresponding to those in FIG. 1 are identified by the same reference numerals. In the present invention, when the voltage supply to the common power source terminal 34 is cut off, interruption of the supply of the operating voltage to the waveform shaping circuit 18, the frequency-voltage converter 19, the sine current generator 21s and the cosine current generator 21c is delayed by delay means 35. The delay means 35 has a construction such, for example, as follows:

The common power source terminal 34 is connected via a protective resistor 36 for current limiting use to the anode of a reverse blocking diode 37, the cathode of which is grounded via a capacitor 38. To the connection point of the diode 37 and the capacitor 38 is connected the base of a transistor 39, which has its emitter connected to operating power source terminals of the waveform shaping circuit 18, the frequency-voltage converter 19, the sine current generator 21s and the cosine current generator 21c. The collector of the transistor 39 is connected to the power source 15 via a transistor protecting diode 41 and a current limiting protective resistor 42. Incidentally, the output of the frequency-voltage converter 19 is supplied to the sine current generator 21s and the cosine current generator 21c via a delay circuit 43 composed of a resistor and a capacitor, by which the indication by the indicator 29 can follow variations in the output voltage signal $v_1$ of the frequency-voltage converter 19 and the pointer 31 can turn fast enough to follow the change in the rotation rate of the engine caused by acceleration or deceleration.

In the embodiment of FIG. 5, when the ignition switch 14 is held in the on state, the power source voltage Vcc is applied from the power source 15 to the common power source terminal 34 to charge the capacitor 38, the voltage of which is provided to the base of the transistor 39, maintaining it in the on state. Accordingly, in this state, the power source voltage Vcc is applied via the transistor 39 from the power source 15 to the operating power source terminal of each of the waveform shaping circuit 18, the frequency-voltage converter 19, the sine current generator 21s and the cosine current generator 21c. As a result of this, the frequency of a detected signal from the detection signal source 11, that is, measured engine speed is indicated on the indicator 29 in the same manner as in the prior art.

Figure 6:
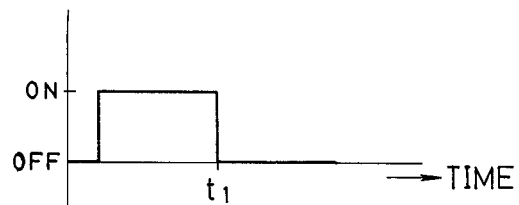
FIGS. 6A and 6B are waveform diagrams explanatory of its operation when the power source voltage is cut off.
Figure 6:
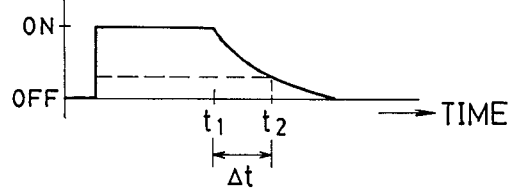

In the abovesaid normal operation, when the ignition switch 14 is turned off to cut off the supply of the power source voltage Vcc to the common power source terminal 34 at a time $t_1$ as shown in FIG. 6A, gradual discharging of charges stored in the capacitor 38 starts at the same time and, as shown in FIG. 6B, the voltage of the capacitor 38 starts to gradually drop at the time $t_1$, turning off the transistor 39 at a time $t_2$ after the lapse of time $\Delta t$. Consequently, even after the ignition switch 14 is turned off, the waveform shaping circuit 18, the frequency-voltage converter 19, the sine-wave current generator 21s and the cosine-wave current generator 21c still operate in the period of time $\Delta t$ after turning off of the ignition switch 14. In this while, the generation of the detection signal from the detection signal source 11 is also stopped by turning off of the ignition switch 14 and, accordingly, the sine and cosine current generators 21s and 21c respectively yield the current signals $i_s$ and $i_c$ corresponding to the zero frequency of the detection signal, resulting in the pointer 31 being quickly returned to the zero point $33_1$.

In my experiments, the capacitor 38 having a capacitance of 33 $\mu$F was used and the aforementioned time interval $\Delta t$ was selected to be 0.3 sec. In the case where the pointer 31 lies near the maximum meter indication $33_n$ immediately before cutting off the ignition switch 14, it may happen sometimes that the pointer 31 does not return to the reference position or zero point $33_1$ within the abovesaid time interval 0.3 sec. This can be avoided by increasing the capacitance of the capacitor 38 or using a zero resetting magnet as will be described hereinbelow.

Figure 7:
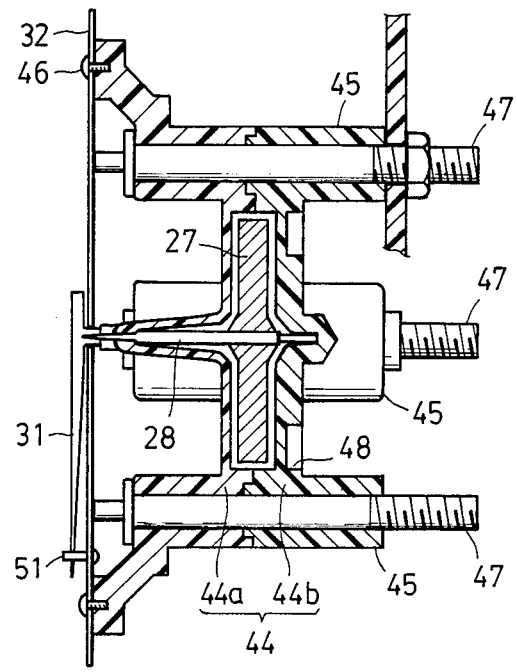
FIG. 7 is a sectional view illustrating an example of the constructing of the tachometer, with a coil removed.
Figure 8:
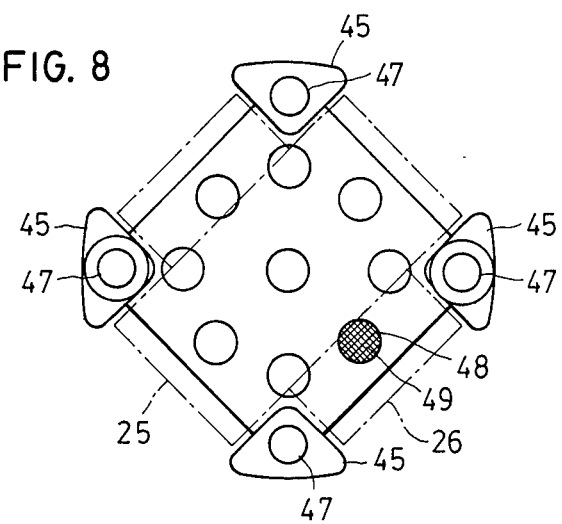
FIG. 8 is a rear side view of the tachometer.

For example, as shown in FIGS. 7 and 8, the rotary magnet 27 is rotatably disposed in a frame 44 made of a synthetic resinous material. The frame 44 is divided in a direction perpendicular to the axis of the rotary magnet 27 into frame halves 44a and 44b. The shaft 28 of the rotary magnet 27 is rotatably supported by the frame 44 and its one end projects out of the frame 44. The frame 44 is square-shaped and has at its four corners struts 45 formed integrally therewith to extend in parallel to the shaft 28 and the dial 32 is mounted by screws 46 on the struts 45 at one end thereof. As shown in FIG. 8 by broken lines, the coils 25 and 26 are wound on the frame 44 between the struts 45. A terminal 47 is inserted into each strut 45 and leads of the coils 25 and 26 are connected to corresponding ones of the terminals 47. In one of depressions 48 formed in the outer surface of the frame 44 zero resetting magnet 49 is fitted in opposing relation to the marginal portion of one surface of the rotary magnet 27. Furthermore, a stopper pin 51 is planted on the dial 32 as shown in FIGS. 4 and 7.

As described previously, upon turning off the ignition switch 14, the sine and cosine current generators 21s and 21c are driven to turn the pointer 31 towards the zero point $33_1$. This rotational movement of the pointer 31 is performed by relatively large and constant torque, so that even if the power supply to the circuits 18, 19, 21c and 21s is cut off before the pointer 31 returns to the zero point $33_1$, that is, even if the time $\Delta t$ has elapsed after turning off of the ignition switch 14, the pointer 31 returns to the zero point $33_1$, turning by the action of the zero resetting magnet 49 in the direction in which the meter indication decreases. In this case, since the magnetic field intensity of the zero resetting magnet 49 may be low, an error in the rotating speed indication by the zero resetting magnets 49 is negligible and the pointer 31 smoothly rotates.

In FIG. 5, the transistor 39 performs a sort of amplification and after turning off the switch 14 the capacitor 38 supplies the base current to the transistor 39, which is relatively small. Without using the resistor 42, diode 41 and transistor 39 and selecting the capacitance of the capacitor 38 sufficiently large, the connection point of the diode 37 and the capacitor 38 may also be connected to the operating power source terminals of the circuits 18, 19, 21s and 21c. The time $\Delta t$, during which the circuits 18, 19, 21s and 21c operate after turning off of the ignition switch 14, is a time necessary for the pointer 31 to return from the position of the maximum speed indication $33_n$ to the zero point $33_1$ in the case where the zero resetting magnet 49 is not employed. When the zero resetting magnet 49 is used, the time $\Delta t$ is selected only enough to turn the pointer 31 back to the position where it can be returned by the zero resetting magnet 49 to the zero point $33_1$.

Sometimes the detection signal at the terminal 17 does not disappear immediately when the ignition switch 14 is turned off. That is to say, various motors may be connected to the common power source terminal 34 and, in this case, when the ignition switch 14 is turned off, the motor rotates by inertia and acts as a generator and its generated output is applied to the common power source terminal 34, resulting in the detection signal appearing at the terminal 17. Also there are cases where rotation speed is obtained from such as a rotating shaft in a mechanical rotational system rather than from such an ignition coil 12. Since such a mechanical rotational system including the rotary shaft has a mechanical inertia, the system may not stop immediately after interrupting the power supply for driving the rotational system. Accordingly, it may happen in some cases that the application of the detection signal to the terminal 17 still continues even after turning off the power source switch 14 which controls the application of the power source voltage to the common power source terminal 34. In such a case, the voltage signals which are supplied to the sine-wave and cosine-wave current generators 21s and 21c during the delay time $\Delta t$ provided by the delay means 35 are controlled so that the rotational frequency may be reduced.

Figure 9:
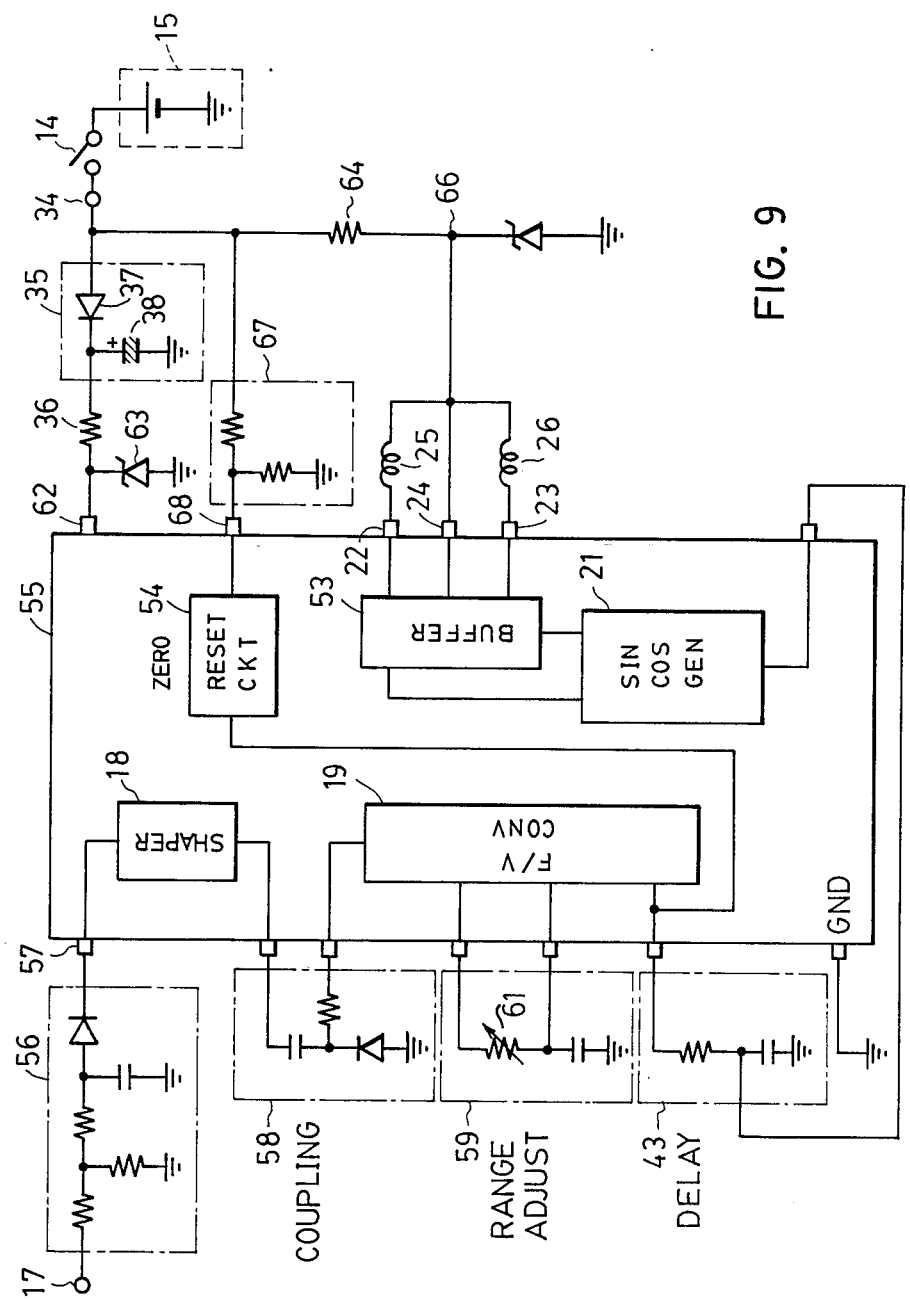
FIG. 9 is a block diagram illustrating another embodiment of the tachometer of the present invention.

An example of the arrangement therefor is illustrated in FIG. 9 in which the parts corresponding to those in FIG. 5 are identified by the same reference numerals. In this example, the waveform shaping circuit 18, the frequency-voltage converter 19, the sine-cosine current generator 21, a buffer amplifier 53 for amplifying its sine-wave and cosine-wave output currents and a zero resetting circuit 54 are constituted as a semiconductor integrated circuit (hereinafter referred to as the IC) 55.

The detection signal from the terminal 17 is provided via a high-frequency noise removing filter 56 to an input terminal 57 of the IC 55. The output of the waveform shaping circuit 18 is applied via an off-chip coupling circuit 58 to the frequency-voltage converter 19. To the frequency-voltage converter 19 is connected an off-chip range adjustment circuit 59 and its variable resistor 61 is adjusted so that the converter 19 may produce a predetermined maximum output voltage for a maximum input frequency thereto. The output of the frequency-voltage converter 19 is supplied via the off-chip delay circuit 43 to the sine-cosine current generator 21. The common power source terminal 34 is connected to a power source terminal 62 of the IC 55 via the delay means 35 and the protective resistor 36. The power source terminal 62 is grounded via an IC protecting Zener diode 63. The common power source terminal 34 is grounded via a resistor 64 and a Zener diode 65, and the connection point 66 of the resistor 64 and the Zener diode 65 is connected to the common terminal 24.

Figure 10:
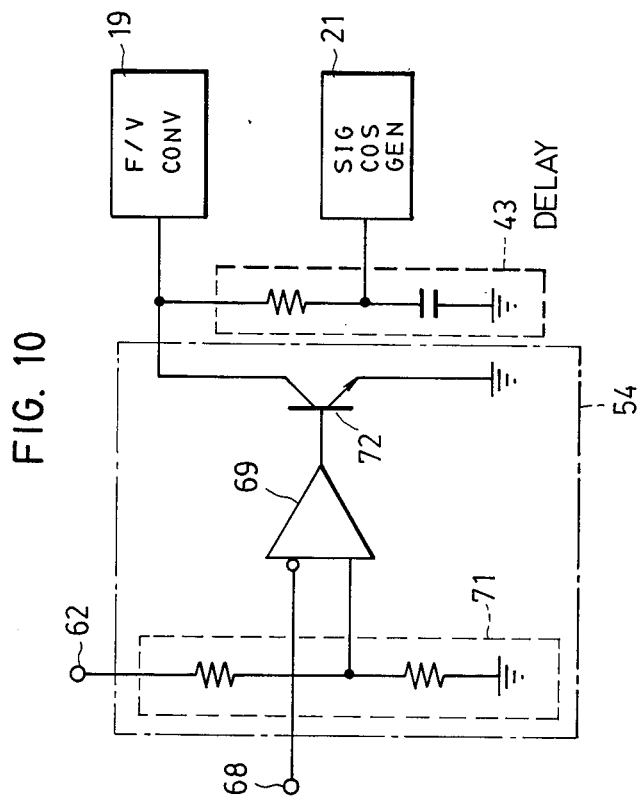
FIG. 10 is a circuit diagram illustrating a specific example of a zero resetting circuit used in the embodiment of FIG. 9.

The common power source terminal 34 is connected to the input side of the zero resetting circuit 54 via a voltage divider 67 and an IC terminal 68. In the zero resetting circuit 54, for example, as shown in FIG. 10, an input from the IC terminal 68 is applied to one end of a comparator 69 for comparison with the output of a voltage divider 71 which voltage divider divides the voltage at the IC terminal 62. The output side of the comparator 69 is connected to the base of a transistor 72, which has its emitter grounded and its collector connected to the connection point of the frequency-voltage converter 19 and the delay circuit 43.

With the arrangement shown in FIGS. 9 and 10, when the switch 14 is turned on, the voltage of the power source 15, for instance, 12 V, is applied to the IC terminal 62 and the voltage 12 V is voltage divided by the voltage divider 67, from which 2 V is provided to the IC terminal 68. This voltage 2 V is compared with the output voltage 1.3 V of the voltage divider 71 in FIG. 10 and the output of the comparator 69 becomes low-level, turning off the transistor 72. Consequently, the output of the frequency-voltage converter 19 varies up to a predetermined maximum voltage, e.g. 4 V in response to the detection signal from the terminal 17 and the output buffer amplifier 53 of the sine-cosine current generator 21 derives sine and cosine currents of, for example, 0 to 9 V at the terminals 22 and 23 in response to the output voltage of the frequency-voltage converter 19. The predetermined maximum output voltage of the frequency-voltage converter 19 is adjustable by means of the range adjustment circuit 59. The common terminal 24 is supplied with 4.5 V from the connection point 66. By currents flowing through the coils 25 and 26, an indication is provided corresponding to the frequency of the input detection signal as described previously.

Upon turning off the switch 14, the voltage at the IC terminal 68 immediately drops to zero but the voltage at the terminal 62 gradually lowers due to charges stored in the capacitor 38. Accordingly, the output of the voltage divider 71 does not immediately become zero and the output of the comparator 69 becomes high-level. That is, a zero reset command is issued and the transistor 72 is turned on and then the output of the frequency-voltage converter 19 becomes substantially zero through the transistor 72. The capacitance of the capacitor 38 is 1000 $\mu F$ and the time $\Delta t$ until the voltage at the IC terminal 62 drops to 9 V after turning off the switch 14 is 0.35 sec. and, in this while, the internal circuits of the IC 55 continue to operate. Accordingly, in this time interval Δt, the input voltage to the sine-cosine current generator 21 drops in the direction of 0 V and the pointer 31 turns towards the zero point. In consequence, even if a detection signal is applied from the terminal 17 after turning off of the switch 14, the pointer 31 returns to the zero point $33_1$ without fail. Furthermore, the example shown in FIG. 9 has only three terminals for external connections, that is, the terminal 17, the common power source terminal 34 and the grounding terminal, whereas the example of FIG. 5 calls for the terminals for connection with the power source 15 and the resistor 42 in addition to the abovesaid terminals. Therefore, the example of FIG. 9 is simpler in arrangement than the example of FIG. 5. Since the transistor 39 in FIG. 5 performs amplification as mentioned previously, however, the delay means 35 may also be arranged as shown in FIG. 5 although the number of terminals increases by one. The sine and cosine currents by the sine and cosine current generators 21s and 21c and the sine-cosine current generator 21 need not always be exact sine-wave and cosine-wave within the input range but they may also be, for instance, currents having trapezoidal waveforms on both positive and negative sides and displaced 90 degrees apart in phase, that is, sine and cosine waves having their peak portions flattened. In FIG. 10 the transistor 72 may also be connected between the delay circuit 43 and the sine-cosine current generator 21. In the case where it is likely that when the input to the sine-cosine current generator 21 is quickly reduced to zero, the rotational movement of the pointer 31 does not follow it, however, the transistor 72 may preferably be connected as shown in FIG. 10.

The tachometer of the present invention can be employed not only for indicating the engine speed or the travelling speed of a vehicle but also for measuring the rotational frequency of an engine for use in a motor boat, agricultural and other industrial machinery and the number of revolutions (per unit time) of other ordinary rotary members. It will be apparent that many modifications and variations may be effected without departing from the scope of the novel concepts of the present invention.

What is claimed is:
1. A tachometer comprising:
   a detection signal source operative to generate a detection signal having a frequency corresponding to a rotational frequency to be measured;
   a frequency-voltage converter coupled to said detection signal source, for converting said detection signal into a voltage signal having a voltage value corresponding to said frequency;
   a sine-cosine current generator connected to said frequency-voltage converter for generating a sine-wave current signal having a substantially sine value corresponding to the voltage value of said voltage signal and for generating a cosine-wave current signal having a substantially cosine value corresponding to the voltage value of said voltage signal, one cycle of each of the sine-wave and cosine-wave current signals corresponding to the range from minimum to maximum voltage values of said voltage signal;
   a cross-coil type indicator comprising first and second coils connected to the output side of said sine-cosine current generator, said coils being disposed with their axes substantially perpendicular intersecting each other and said coils being supplied with said sine-wave current signal and said cosine-wave current signal, respectively, said indicator including a rotary magnet rotatably disposed in a composite magnetic field of the magnetic fields set up by currents flowing through the first and second coils, a pointer being mounted on the rotary shaft of the rotary magnet and a dial being provided adjacent said pointer for indicating the rotational angular position of the pointer as a rotational frequency; and
   delay means connected between said frequency-voltage converter, said sine-cosine current generator and a power source, for delaying interruption of the operation of the frequency-voltage converter and the sine-cosine current generator when the supply of their operating voltages is cut off;
   said cross-coil type indicator including a square-shaped frame of a synthetic resinous material in which said rotary magnet is mounted and on which said first and second coils are wound with their axes perpendicular to said rotary shaft of said rotary magnet, said frame having a plurality of depressions formed in one outer face thereof and arranged around said rotary shaft, and a zero-resetting magnet fitted in one of said depressions in opposing relation to a marginal portion of said rotary magnet so that when said pointer is brought near to a zero-point of said dial, said zero-resetting magnet magnetically interacts with said rotary magnet to force said pointer to move to said zero-point.

2. A tachometer according to claim 1 wherein the delay means comprises a diode connected at one end to the power source in a forward direction and a capacitor connected between the other end of the diode and ground, the connection point of the diode and the capacitor being connected to operating power source terminals of the frequency-voltage converter and the sine-cosine current generator.

3. A tachometer according to claim 2 wherein amplifying means is connected between the connection point of the diode and the capacitor and the frequency-voltage converter and the sine-cosine current generator, for amplifying a voltage at the connection point.

4. A tachometer according to claim 1 further including a stopper for preventing the pointer from moving past said zero-point by engagement with a rotating system, including the pointer, having turned in a direction in which rotational frequency indication decreases.

5. A tachometer according to claim 1 further including a zero resetting circuit comprising a comparator for detecting a decrease in the power source voltage below a predetermined value, and level reducing means for reducing the input to the sine-cosine current generator by the output of the comparator.

6. A tachometer according to claim 5 further including a delay circuit comprising a resistor and a capacitor connected between the frequency-voltage converter and the sine-cosine current generator, for delaying application of the voltage signal to the sine-cosine current generator.

7. A tachometer according to claim 6 wherein the level reducing means is connected between the delay circuit and the frequency-voltage converter.

* * * * *